(12) United States Patent
Sugawara et al.

(10) Patent No.: US 10,312,233 B2
(45) Date of Patent: Jun. 4, 2019

(54) SEMICONDUCTOR DEVICE (71) Applicant: Mitsubishi Electric Corporation, Chiyoda-ku (JP)

(72) Inventors: Katsutoshi Sugawara, Tokyo (JP); Yasuhiro Kagawa, Tokyo (JP); Rina Tanaka, Tokyo (JP); Yutaka Fukui, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/505,508

(22) PCT Filed: Sep. 16, 2015

(86) PCT No.: PCT/JP2015/076318
§ 371 (c)(1),
(2) Date: Feb. 21, 2017

(87) PCT Pub. No.: WO2016/052203
PCT Pub. Date: Apr. 7, 2016

(65) Prior Publication Data
US 2017/0271323 A1  Sep. 21, 2017

(30) Foreign Application Priority Data
Sep. 30, 2014  (JP) .................................. 2014-199781

(51) Int. Cl.
*H01L 29/66* (2006.01)
*H01L 27/02* (2006.01)
(Continued)

(52) U.S. Cl.
CPC ........ *H01L 27/0296* (2013.01); *H01L 21/046* (2013.01); *H01L 21/0475* (2013.01);
(Continued)

(58) Field of Classification Search
CPC ............... H01L 21/046; H01L 21/0475; H01L 27/0288; H01L 27/0296; H01L 29/0623;
(Continued)

(56) References Cited

U.S. PATENT DOCUMENTS 6,621,107 B2    9/2003  Blanchard et al.
7,956,409 B2    6/2011  Yamamoto et al.
(Continued)

FOREIGN PATENT DOCUMENTS

JP    2005-501408 A    1/2005
JP    2005-142243 A    6/2005
(Continued)

OTHER PUBLICATIONS

International Search Report dated Dec. 15, 2015 in PCT/JP2015/076318 Filed Sep. 16, 2015.
(Continued)

*Primary Examiner* — Meiya Li
(74) *Attorney, Agent, or Firm* — Oblon, McClelland, Maier & Neustadt, L.L.P.

(57) ABSTRACT

A semiconductor device includes a base region of second conductivity type formed on a drift layer of first conductivity type, a source region of first conductivity type located in the base region, a trench passing through the base region and the source region and dividing cell regions in plan view, a protective diffusion layer of second conductivity type disposed on a bottom of the trench, a gate electrode embedded in the trench with a gate insulating film therebetween, a source electrode electrically connected to the source region, and a protective contact region disposed at each of positions of three or more cell regions and connecting the protective diffusion layer and the source electrode to each other. The protective contact regions are disposed such that a triangle
(Continued)

whose vertices are centers of three protective contact regions located closest to one another is an acute triangle.

9 Claims, 8 Drawing Sheets

(51) Int. Cl.
| | |
|---|---|
| *H01L 29/78* | (2006.01) |
| *H01L 29/06* | (2006.01) |
| *H01L 29/417* | (2006.01) |
| *H01L 29/16* | (2006.01) |
| *H01L 21/04* | (2006.01) |
| *H01L 29/10* | (2006.01) |
| *H01L 29/739* | (2006.01) |

(52) U.S. Cl.
CPC ...... *H01L 27/0288* (2013.01); *H01L 29/0623* (2013.01); *H01L 29/0696* (2013.01); *H01L 29/1087* (2013.01); *H01L 29/1608* (2013.01); *H01L 29/41766* (2013.01); *H01L 29/7397* (2013.01); *H01L 29/7802* (2013.01); *H01L 29/7813* (2013.01)

(58) Field of Classification Search
CPC ............. H01L 29/0696; H01L 29/1087; H01L 29/1608; H01L 29/41766; H01L 29/7397; H01L 29/7802; H01L 29/7813; H01L 29/12
See application file for complete search history.

(56) References Cited

U.S. PATENT DOCUMENTS

| | | | |
|---|---|---|---|
| 8,735,906 | B2 | 5/2014 | Nakano |
| 9,224,860 | B2 | 12/2015 | Kagawa et al. |
| 9,252,261 | B2 | 2/2016 | Yamagami et al. |
| 2003/0040144 | A1 * | 2/2003 | Blanchard ........... H01L 29/7813 438/145 |
| 2009/0250750 | A1 | 10/2009 | Takemori et al. |
| 2013/0270576 | A1 | 10/2013 | Masuda et al. |
| 2016/0071922 | A1 | 3/2016 | Kagawa et al. |

FOREIGN PATENT DOCUMENTS

| | | | | |
|---|---|---|---|---|
| JP | 2009-76540 A | | 4/2009 | |
| JP | 2010-114152 A | | 5/2010 | |
| JP | WO 2012077617 A1 | * | 6/2012 | .......... H01L 29/7811 |
| JP | 2013-55177 A | | 3/2013 | |
| JP | 2013-219293 A | | 10/2013 | |
| WO | 2007/034547 A1 | | 3/2007 | |
| WO | 2010/119789 A1 | | 10/2010 | |
| WO | 2012/077617 A1 | | 6/2012 | |
| WO | 2012/144271 A1 | | 10/2012 | |

OTHER PUBLICATIONS

International Preliminary Report on Patentability and Written Opinion dated Apr. 13, 2017 in PCT/JP2015/076318 (with English language translation).

* cited by examiner

SEMICONDUCTOR DEVICE

TECHNICAL FIELD

The present invention relates to semiconductor devices.

BACKGROUND ART

In electronics equipment, insulated gate semiconductor devices, such as insulated gate bipolar transistors (IGBTs) and metal oxide semiconductor field effect transistors (MOSFETs), are widely used as switching elements for controlling power supply to loads such as motors. One example of such an insulated gate semiconductor device is a trench-gate MOSFET in which a gate electrode is embedded in a semiconductor layer.

For example, MOSFET cells (cell regions) connected in parallel are treated as one semiconductor device in a typical vertical MOSFET. In other words, a semiconductor device including a vertical MOSFET is formed by arranging MOSFET cells. Typical examples of the arrangement patterns of MOSFET include a cell pattern and a stripe pattern. In the cell pattern, MOSFET cells each including a square source region surrounded by a gate trench are arranged in a lattice pattern. In the stripe pattern, MOSFET cells are arranged in a comb pattern by disposing gate trenches between elongated, stripe-shaped source regions.

During the off state of the semiconductor device, an electric field tends to concentrate on an insulating film on the bottom of a trench in the trench MOSFET, on which, the reliability of the insulating film is low. To overcome such a problem, for example, Patent Document 1 proposes a technique of extending a depletion layer in a drift layer of first conductivity type on the bottom of the trench to provide, on the bottom of the trench, a protective diffusion layer of second conductivity type that can reduce an electric field to be applied to the insulating film on the bottom of the trench.

If a protective diffusion layer has a floating potential, electrical characteristics such as switching characteristics may become unstable, so it is desirable that the potential of the protective diffusion layer be grounded. For example, Patent Document 2 proposes a method for setting one of the MOSFET cells as a protective contact region and grounding the protective diffusion layer through the protective contact region in the cell pattern.

PRIOR ART DOCUMENTS

Patent Documents

Patent Document 1: Japanese Patent Application Laid-Open No. 2005-142243

Patent Document 2: WO 2012/077617

SUMMARY OF INVENTION

Problem to be Solved by the Invention

In a lattice-shaped cell pattern, when the MOSFET cell is replaced by a protective contact region for each of the cell regions located at constant intervals to provide a lattice pattern, the channel density decreases because the protective contact region does not function as a MOS channel. This in turn leads to an increase in on-resistance. To reduce such on-resistance, therefore, fewer protective contact regions are desirable. The inventors have found that short-circuit withstand capability depends on the arrangement of the protective contact regions. This capability is indicated by a time from a start of flow of a short-circuit current in, for example, a short-circuit of a load to breakdown of a semiconductor device. When the load is short-circuited, a high voltage is instantaneously applied to the drain side of the MOSFET, and accordingly, a voltage is applied reversely to a semiconductor layer of first conductivity type from the protective diffusion layer of second conductivity type, thus extending a depletion layer. The depletion layer extends slowly in the vicinity of the protective diffusion layer located remotely from the protective contact region. The short-circuit current flowing from the drain side in short-circuit concentrates in a region in which the depletion layer extends a little. The inventors have thus found that around the protective diffusion layer located remotely from the protective contact region, a short-circuit current locally concentrates and causes a short-circuit breakdown until the depletion layer extends completely. To improve short-circuit withstand capability, thus, the distance between the protective contact region and the protective diffusion layer is desirably made small. In other words, there is a trade-off relationship between the restraint of an increase in on-resistance and the improvement in short-circuit withstand capability.

The present invention has been made to solve the problem above, and therefore has an object to provide a semiconductor device capable of improving short-circuit withstand capability while restraining an increase in on-resistance.

Means to Solve the Problem

A semiconductor device according to the present invention includes a substrate, a drift layer of first conductivity type, a base region of second conductivity type, a source region of first conductivity type, a trench, a protective diffusion layer of second conductivity type, a gate insulating film, a gate electrode, a source electrode, and a protective contact region. The drift layer is provided on the substrate. The base region is formed on the drift layer. The source region is located in the base region. The trench passes through the base region and the source region and divides cell regions in plan view. The protective diffusion layer is disposed on a bottom of the trench in the drift layer. The gate insulating film is formed on an inner wall of the trench. The gate electrode is embedded in the trench with the gate insulating film therebetween. The source electrode is electrically connected to the source region. The protective contact region is disposed at positions of each of three or more of the cell regions and connects the protective diffusion layer and the source electrode to each other. The protective contact regions are disposed such that a triangle whose vertices are centers of three of the protective contact regions located closest to one another is an acute triangle. The protective diffusion layer is disposed on the bottom of the trench over an entire semiconductor region including said cell regions and said protective contact region. The cell region and the protective contact region have the same width in plan view.

Effects of the Invention

In the semiconductor device according to the present invention, the protective contact region connecting the protective diffusion layer and the source electrode to each other is disposed such that the triangle, whose vertices are the centers of three protective contact regions located closest to one another, is an acute triangle. Thus, if the same number of protective contact regions are provided, the distance from the protective contact region to a point farthest therefrom can be made smaller than in the case where the protective contact regions are arranged in a lattice pattern. This improves short-circuit withstand capability while restraining an increase in on-resistance.

DESCRIPTION OF EMBODIMENTS

First Embodiment

Figure 1:
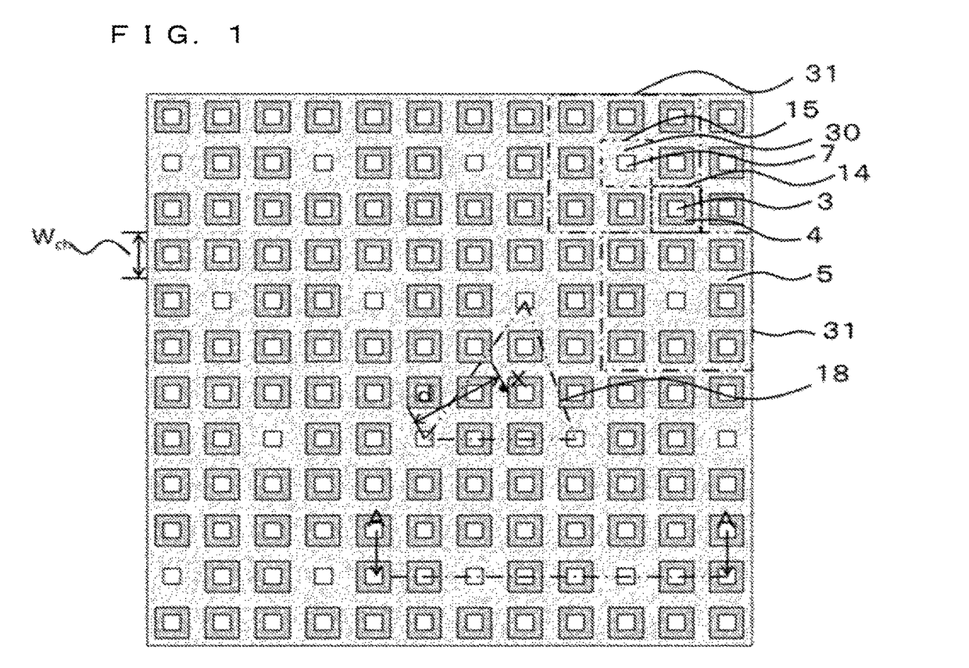
FIG. 1 is a plan view of an example of a semiconductor device according to a first embodiment of the present invention.

First, a semiconductor device according to a first embodiment of the present invention will be described. FIG. 1 is a plan view for explaining the semiconductor device according to the first embodiment of the present invention. Illustrated herein as an example of the semiconductor device is a trench gate MOSFET that is a silicon carbide semiconductor device including silicon carbide (SiC).

The present embodiment is not limited to the description below, and can be modified as appropriate within the scope of the present invention. For easy understanding, the scales of the members may differ from actual ones in the drawings below. The same applies to the scales among the drawings.

FIG. 1 illustrates a MOSFET region that is part of an active region of the trench gate MOSFET. The MOSFET region is formed of cell regions 14, which are surrounded by dotted lines, and protective contact regions 15, which are surrounded by alternate long and short dashed lines. The cell region 14 is a single MOSFET cell. The MOSFET region is covered with an interlayer insulating film 9 and a source electrode 10. In the cell region 14, a source region 4 is connected to the source electrode 10 through a contact hole 14a made in the interlayer insulating film 9. In FIG. 1, the interlayer insulating film 9 and the source electrode 10 are omitted.

With reference to FIG. 1, the source region 4 of first conductivity type is formed in a rectangle shape. The cell regions 14 of cell type, in each of which the source region 4 is surrounded by a trench 5 in which a gate electrode 8 is embedded, are arranged in a lattice pattern. That is to say, the trench 5 divides the MOSFET region into a plurality of cell regions 14 in plan view. The rectangle inside the source region 4 is a base region 3 of second conductivity type. On the bottom of the trench 5, a protective diffusion layer 7 of second conductivity type is formed along the trench 5 (illustrated in FIG. 2).

As illustrated in FIG. 1, in the present embodiment, the center of a division 31 formed of nine cell regions 14 is replaced by the protective contact region 15. In other words, the protective contact regions 15 are arranged at positions of some cell regions 14 among the plurality of cell regions 14 divided by the trench 5. With reference to FIG. 1, an example of the division 31 is surrounded by chain double-dashed lines. In the present embodiment, specifically, the division 31 is formed of eight cell regions 14 and one protective contact region 15. Arranging the divisions 31 in order forms a MOSFET region, that is, an active region.

In the present embodiment, on the paper of FIG. 1, the protective contact regions 15 in the divisions 31 vertically adjacent to one another are arranged while being shifted horizontally. With reference to FIG. 1, the protective contact regions 15 of the divisions 31 vertically adjacent to one another are arranged while being shifted horizontally by an amount of one cell region 14 from the arrangement in which the protective contact regions 15 are located in a lattice pattern. Further, a groove 30 is formed in the protective contact region 15, and the protective diffusion layer 7 is formed also on the bottom of the groove 30 (illustrated in FIG. 2).

Figure 2:
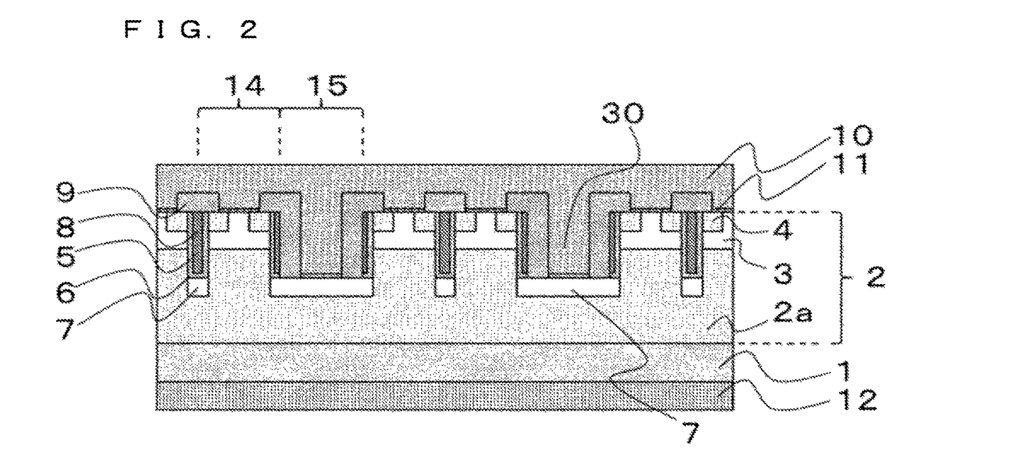
FIG. 2 is a sectional view of the semiconductor device according to the first embodiment of the present invention.

FIG. 2 is a sectional view for explaining the semiconductor device according to the present embodiment. FIG. 2 corresponds to a section taken along a line AA of FIG. 1, and the section includes the cell regions 14 and the protective contact regions 15 in the MOSFET region.

As illustrated in FIG. 2, the MOSFET of the present embodiment is formed using an epitaxial substrate formed of a SiC substrate 1 of n-type that is the first conductivity type and an epitaxial layer 2 (semiconductor layer) of n-type SiC, which is grown on the SiC substrate 1. In the surface portion of the epitaxial layer 2, a base region 3 of p-type that is the second conductivity type is formed, and an n-type region in the epitaxial layer 2 in which no base region 3 is formed serves as a drift layer 2a. The base region 3 has a conductivity type opposite to that of the epitaxial layer 2. The base region 3 is formed on the front surface of the drift layer 2a and is also formed in the surface portion of the epitaxial layer 2.

Although the first conductivity type is n type and the second conductivity type is p type in the present embodiment, needless to say, these conductivity types may be opposite.

The trench 5 in which the gate electrode 8 is embedded is formed in the epitaxial layer 2 so as to penetrate the base region 3. In other words, the bottom of the trench 5 reaches the drift layer 2a below the base region 3. On the bottom surface and the side surface of the gate electrode 8 (the inner wall surface of the trench 5), a gate insulating film 6 is provided. The n-type source region 4 is disposed inside the base region 3 so as to be adjacent to the gate electrode 8 with the gate insulating film 6 between the n-type source region 4 and the gate electrode 8.

Inside the drift layer 2a and below the gate electrode 8 (trench 5), the p-type protective diffusion layer 7 is formed for accelerating the depletion of the drift layer 2a while the MOSFET is turned off and for mitigating the concentration of an electric field on the bottom of the trench 5 to prevent breakdown of the gate insulating film 6. Although the protective diffusion layer 7 is desirably provided on the bottom of the trench 5 over the entire MOSFET region, no protective diffusion layer 7 may be provided.

The groove 30 having the same depth as that of the trench 5 is formed in the protective contact region 15, and the protective diffusion layer 7 is formed also on the bottom of the groove 30. That is to say, the protective diffusion layer 7 on the bottom of the groove 30 is electrically connected with the protective diffusion layer 7 on the bottom of the trench 5.

The interlayer insulating film 9 is formed on the surface of the epitaxial layer 2 and inside the groove 30. In the interlayer insulating film 9 are formed contact holes passing through the interlayer insulating film 9. On the surface of the epitaxial layer 2 and on the bottom of the groove 30, an ohmic electrode 11 having low resistance is formed in the regions in which the contact holes are provided. The ohmic electrode 11 is further connected through the contact hole to the source electrode 10. In other words, the source electrode 10 disposed on the interlayer insulating film 9 is electrically connected to the source region 4 and the base region 3 by the ohmic electrode 11.

The source electrode 10 is further electrically connected to the protective diffusion layer 7 on the bottom of the groove 30 through the ohmic electrode 11 formed on the bottom of the groove 30. Thus, the protective diffusion layer 7 on the bottom of the groove 30 and the protective diffusion layer 7 on the bottom of the trench 5 are electrically connected to the source electrode 10. That is to say, the protective contact region 15 is a region for connecting the source electrode 10 and the protective diffusion layer 7. In other words, to electrically connect the protective diffusion layer 7 on the bottom of the trench 5 to the source electrode 10, the source electrode 10 and the protective diffusion layer 7 are connected in the protective contact region 15. With reference to FIG. 2, the source electrode 10 and the protective diffusion layer 7 are connected to each other through the ohmic electrode 11 in the protective contact region 15, which may be directly connected to each other.

On a rear surface of the SiC substrate 1, a drain electrode 12 is formed.

Description will now be given of a method for manufacturing the MOSFET according to the present embodiment illustrated in FIGS. 1 and 2. FIGS. 3 to 8 are process flowcharts of the method.

Figure 3:
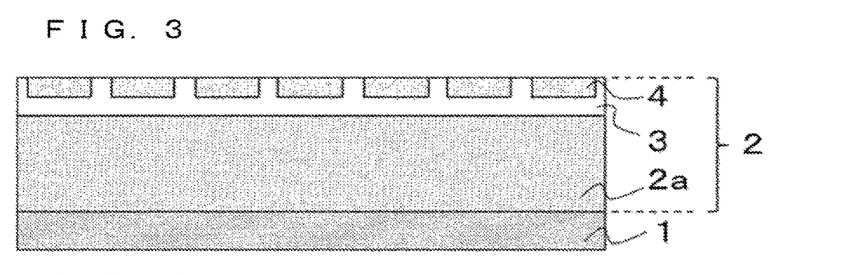
FIG. 3 is a sectional view for explaining up to the formation of a source region in a method for manufacturing a MOSFET according to the first embodiment of the present invention.

FIG. 3 is a sectional view for explaining up to the formation of the source region 4 in the method for manufacturing the MOSFET according to the present embodiment. First, an epitaxial layer 2 (semiconductor layer) is formed on the SiC substrate 1. Herein, an n-type, low-resistance SiC substrate 1 of 4H polytype is prepared, and an n-type epitaxial layer 2 is epitaxially grown on the SiC substrate 1 by chemical vapor deposition (CVD), thus forming an epitaxial substrate. The epitaxial layer 2 may have, for example, an impurity concentration of $1\times10^{14}$ cm$^{-3}$ to $1\times10^{17}$ cm$^{-3}$ and a thickness of 5 μm to 200 μm.

Then, a predetermined dopant is ion-implanted into the surface portion of the epitaxial layer 2, thereby forming a base region 3 and a source region 4. The base region 3 is formed by ion implantation of aluminum (Al) that is a p-type impurity. The depth of Al ion implantation is approximately 0.5 μm to 3 μm within a range in which the thickness of the epitaxial layer 2 is not exceeded. The impurity concentration of Al to be implanted is made higher than the concentration of an n-type impurity of the epitaxial layer 2. At this time, the region of the epitaxial layer 2 located at the depth greater than the depth of the Al implantation remains as an n-type drift layer 2a.

The base region 3 may be formed by epitaxially growing a p-type layer on the epitaxial layer 2. Also in that case, the impurity concentration and the thickness of the base region 3 fall within the ranges similar to those in the formation of ion implantation.

The source region 4 is formed by ion implantation of nitrogen (N) that is an n-type impurity into the surface portion of the base region 3. The source region 4 is formed in a lattice pattern corresponding to the layout of a gate electrode 8 (trench 5) to be formed later (see FIG. 1). Consequently, the source region 4 is disposed at opposite sides of the gate electrode 8 when the trench 5 is formed. The ion implantation depth of N is smaller than the thickness of the base region 3. The impurity concentration of N to be implanted is made higher than the p-type impurity concentration of the base region 3, which is within the range of $1\times10^{18}$ cm$^{-3}$ to $1\times10^{21}$ cm$^{-3}$. The order of ion implantation to form the impurity region may not be the order described above as long as the structure illustrated in FIG. 1 is obtained eventually.

Alternatively, an n-type depletion inhibiting layer may be provided below the base region 3. In the structure of FIG. 2, a so-called junction field effect transistor (JFET) resistance occurs between the base region 3 and a protective diffusion layer 7, which narrows a current path during on time due to a depletion layer extending from both the base region 3 and the protective diffusion layer 7. The depletion inhibiting layer inhibits the depletion layer from extending from the base region 3 during on time, thus reducing a JFET resistance. The depletion inhibiting layer is formed by ion plantation of nitrogen (N) or phosphorous (P) that is an n-type impurity.

The depletion inhibiting layer is deeper than the base region 3 within such a range that the thickness of the epitaxial layer 2 is not exceeded, and desirably has a thickness of approximately 0.05 μm to 3 μm. The impurity concentration of N to be implanted is higher than the n-type impurity concentration of the epitaxial layer 2 and is desirably $1 \times 10^{17}$ cm$^{-3}$ or more and $1 \times 10^{19}$ cm$^{-3}$ or less. The depletion inhibiting layer may be formed by n-type epitaxial growth. In that case, the depletion inhibiting layer has an impurity concentration and a thickness within ranges equivalent to those in the formation by ion implantation.

Figure 4:
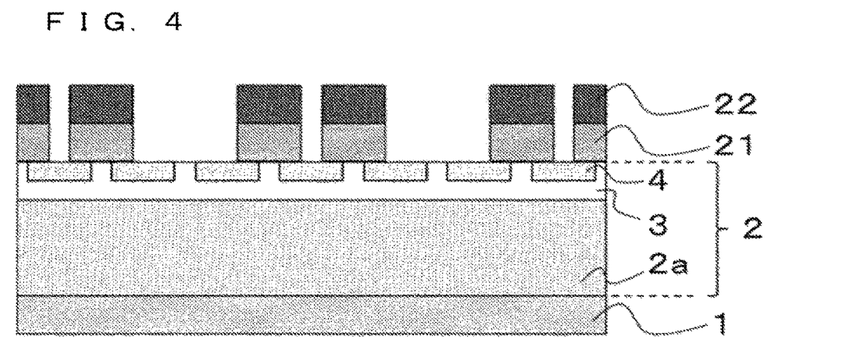
FIG. 4 is a sectional view for explaining up to the formation of an etching mask to form a trench in the method for manufacturing a MOSFET according to the first embodiment of the present invention.

FIG. 4 is a sectional view for explaining up to the formation of an etching mask 22 to a form a trench 5 in the method for manufacturing the semiconductor device according to the present embodiment. A silicon oxide film mask 21 is deposited on the surface of the epitaxial layer 2 illustrated in FIG. 3 for approximately 1 μm to 2 μm, and thereon, an etching mask 22 made of resist material is further formed. The etching mask 22 is formed by photolithography in a pattern with an opening for a region in which the trench 5 is to be formed. Herein, since the trench 5 has a lattice shape, the etching mask 22 has a matrix pattern that is the inverse of the grid shape.

The silicon oxide film mask 21 is then patterned by a reactive ion etching (RIE) process using the etching mask 22 as a mask. In other words, the pattern of the etching mask 22 is transferred to the silicon oxide film mask 21. The patterned silicon oxide film mask 21 is a mask for etching in a step described with reference to FIG. 5.

Figure 5:
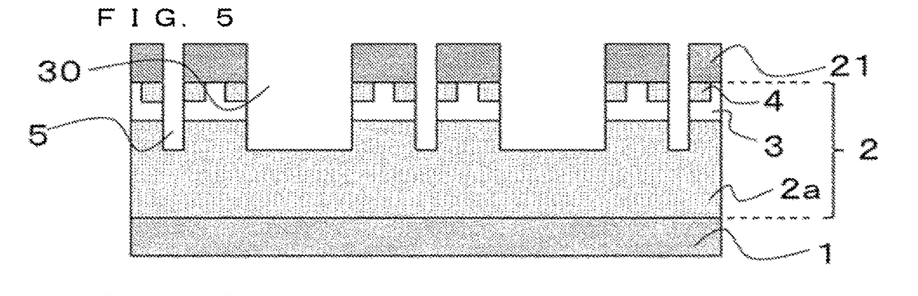
FIG. 5 is a sectional view for explaining up to the formation of a trench in the method for manufacturing a MOSFET according to the first embodiment of the present invention.

FIG. 5 is a sectional view for explaining up to the formation of the trench 5 in the method for manufacturing the semiconductor device according to the present embodiment. The RIE using the silicon oxide film mask 21 patterned as illustrated in FIG. 4 as a mask forms the trench 5 passing through the source region 4 and the base region 3 in the epitaxial layer 2. The depth of the trench 5 is greater than or equal to the depth of the base region 3 and is approximately 0.6 μm to 6.0 μm. At this time, the protective contact region 15 is etched similarly, thus forming a groove 30.

Figure 6:
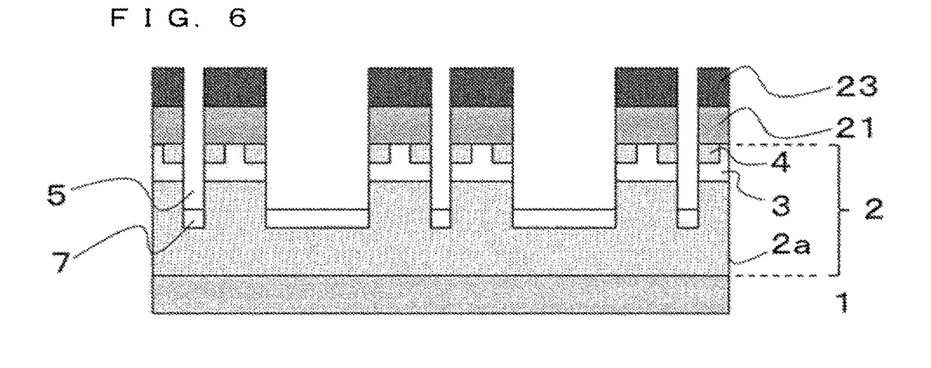
FIG. 6 is a sectional view for explaining up to the formation of a protective diffusion layer in the method for manufacturing a MOSFET according to the first embodiment of the present invention.

FIG. 6 is a sectional view for explaining up to the formation of the protective diffusion layer 7 in the method for manufacturing the semiconductor device according to the present embodiment. An implantation mask 23 having a pattern similar to that of the etching mask 22, which is the pattern with an opening for the trench 5, is formed on the silicon oxide film mask 21, and ion implantation is performed using the implantation mask 23 as a mask, thus forming a p-type protective diffusion layer 7 on the bottom of the trench 5. At this time, ion implantation into the bottom of the groove 30 of the protective contact region 15 is simultaneously performed, thus forming the protective diffusion layer 7.

To form the protective diffusion layer 7, Al is used as a p-type impurity. The impurity concentration of Al to be implanted desirably falls within the range of $1 \times 10^{17}$ cm$^{-3}$ to $1 \times 10^{19}$ cm$^{-3}$, and more desirably, within the range of $3 \times 10^{17}$ cm$^{-3}$ to $1 \times 10^{18}$ cm$^{-3}$. At a lower impurity concentration of the protective diffusion layer 7, an effect of mitigating an electric field of the gate insulating film 6 inside the trench 5 cannot be achieved sufficiently. This is because at a higher impurity concentration of the protective diffusion layer 7, the depletion layer extending from the protective diffusion layer 7 becomes large during on time, narrowing a path for on-current to increase on-resistance.

The protective diffusion layer 7 in the protective contact region 15 may have a concentration distribution. Ohmic resistance can be reduced by providing a high concentration region of, for example, $5 \times 10^{18}$ cm$^{-3}$ to $1 \times 10^{21}$ cm$^{-3}$ in the region that is in contact with the ohmic electrode 11 in the protective contact region 15. The switching characteristics can therefore be improved.

The silicon oxide film mask 21, which has been patterned as an etching mask in the formation of the trench 5, may be used in place of the implantation mask 23. This simplifies manufacturing steps and reduces manufacturing costs. In the use of the silicon oxide film mask 21 in place of the implantation mask 23, the thickness and etching conditions of the silicon oxide film mask 21 need to be adjusted such that the silicon oxide film mask 21 with some thickness remains after the formation of the trench 5.

After the ion implantation for forming the protective diffusion layer 7, the implantation mask 23 is removed, and annealing is performed with a heat treatment apparatus to activate the ion-implanted impurity. Such annealing is performed in an inert gas atmosphere of argon (Ar) gas or any other gas or in a vacuum at 1300° C. to 1900° C. for 30 seconds to one hour.

Figure 7:
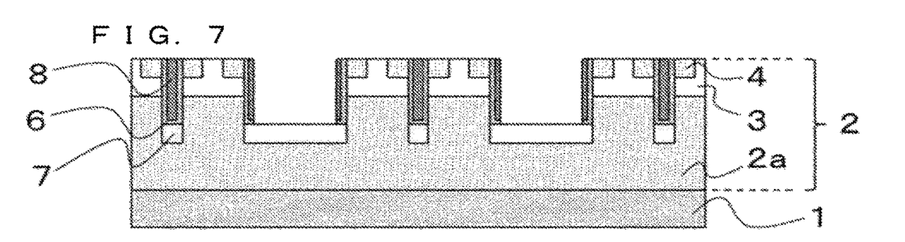
FIG. 7 is a sectional view for explaining up to the formation of a gate electrode in the method for manufacturing a MOSFET according to the first embodiment of the present invention.

FIG. 7 is a sectional view for explaining up to the formation of a gate electrode 8 in the method for manufacturing the semiconductor device according to the present embodiment. A silicon oxide film to serve as a gate insulating film 6 is formed on the entire surface of the epitaxial layer 2 including the inner wall of the trench 5. The silicon oxide film to serve as the gate insulating film 6 may be formed by thermal oxidation of the surface of the epitaxial layer 2 or may be formed by deposition on the epitaxial layer 2. The material for the gate insulating film 6 may be aluminum oxide ($Al_2O_3$) or silicon nitride (SiN) other than a silicon oxide film.

After that, polysilicon to serve as the gate electrode 8 is deposited by low pressure CVD. Further, the silicon oxide film and the polysilicon are patterned or etched back, thus forming the gate insulating film 6 and the gate electrode 8 in the trench 5. At this time, the gate electrode 8 is formed also on the side surface of the groove 30. In the protective contact region 15, however, the polysilicon inside the groove 30 is etched back.

Figure 8:
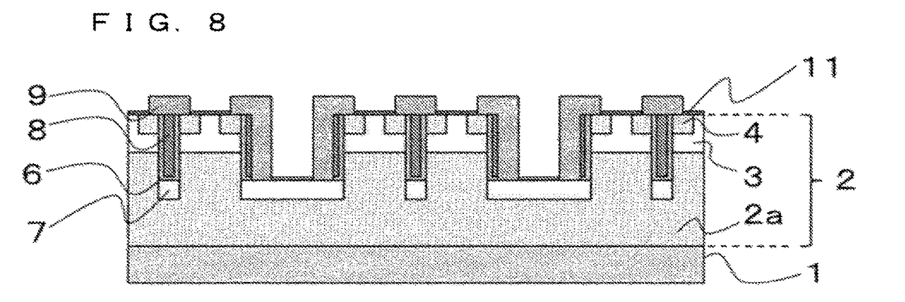
FIG. 8 is a sectional view for explaining up to the formation of an ohmic electrode in the method for manufacturing a MOSFET according to the first embodiment of the present invention.

FIG. 8 is a sectional view for explaining up to the formation of the ohmic electrode 11 in the method for forming the semiconductor device according to the present embodiment. An insulating film to serve as the interlayer insulating film 9 is formed on the entire surface of the epitaxial layer 2 by low pressure CVD to cover the gate electrode 8. The material for the interlayer insulating film 9 may be, for example, silicon dioxide ($SiO_2$), silicon nitride (SiN), or phosphor silicate glass (PSG).

The interlayer insulating film 9 is then patterned to form contact holes such that the contact holes reach the surfaces of the source region 4 and the base region 3 in the cell region 14 and reach the surface of the protective diffusion layer 7 in the protective contact region 15.

Subsequently, the ohmic electrode 11 is formed in the regions exposed on the bottoms of the contact holes. In one example method for forming the ohmic electrode 11, a metal film mainly containing Ni is deposited on the entire surface of the epitaxial layer 2 including the contact holes and is caused to react with silicon carbide that is the epitaxial layer 2 by a heat treatment at 600° C. to 1100° C., thus forming a silicide film to serve as the ohmic electrode 11. After that, the metal film that has not reacted and remained on the interlayer insulating film 9 is removed by wet etching using nitric acid, sulfuric acid, hydrochloric acid, or a mixture of one of these acids and a hydrogen peroxide solution. After the removal of the metal film that has remained on the interlayer insulating film 9, a heat treatment may be performed again. In this case, the heat treatment is performed at a temperature higher than that of the heat treatment previously performed, thus forming an ohmic contact having a low contact resistance value.

Then, an electrode material such as an Al alloy is deposited on the epitaxial layer 2, thus forming a source electrode 10 in the interlayer insulating film 9 and in the contact holes. Finally, the electrode material such as an Al alloy is deposited on the rear surface of the SiC substrate 1 to form the drain electrode 12, so that a MOSFET according to the present embodiment having the configuration illustrated in FIGS. 1 and 2 is obtained.

In the MOSFET according to the present embodiment, each of the cell regions 14, that is, the cells divided by the gate electrode 8 has a MOS channel function and functions as a MOSFET. More specifically, the region of the base region 3 in the cell region 14, which is in contact with the gate insulating film 6, forms a MOS channel. The cell region 14 thus functions as a MOSFET cell.

In contrast, the protective contact region 15 in which the groove 30 has been formed includes no MOS interface, and thus, has no MOS channel formed therein. The protective contact region 15 thus loses the function as a MOSFET cell. The protective contact region 15, however, prevents reductions in electrical characteristics by source-grounding the protective diffusion layer 7 so that the protective diffusion layer 7 has a floating potential. For example, a reduction in switching speed can be prevented, and switching operation is prevented from becoming unstable. As the protective diffusion layer 7 is closer to the protective contact region 15, the depletion layer extends more easily from the protective diffusion layer 7 toward the drift layer 2a at the occurrence of a short-circuit, which will be described below.

Figure 9:
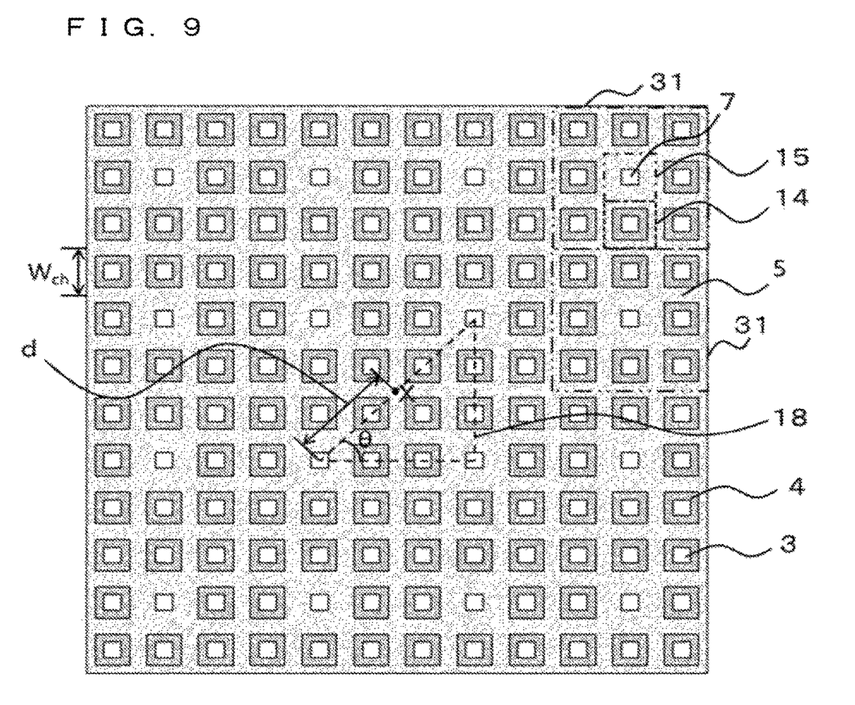
FIG. 9 illustrates a comparative example of a plan view illustrating protective contact regions arranged in a lattice pattern, where the first embodiment of the present invention is not used.

To explain the effects of the semiconductor device according to the present embodiment, FIG. 9 illustrates a comparative example of the plan view in which the protective contact regions 15 are provided in a lattice pattern in the case where the present embodiment is not used. With reference to FIG. 9, as in FIG. 1, the center of the division 31 of nine cell regions 14 surrounded by chain double-dashed lines among the cell regions 14 arranged in a lattice pattern is replaced by the protective contact region 15. With reference to FIG. 9, however, the nine divisions 31 are arranged in a lattice pattern, so that the protective contact regions 15 are disposed in a lattice pattern in the entire MOSFET region. That is to say, the protective contact regions 15 of the divisions 31 vertically adjacent to one another are disposed in a lattice pattern without being shifted horizontally. In other words, the protective contact regions 15 of the divisions 31 vertically adjacent to one another are formed at the positions of the cell regions 14 in the same column.

It is assumed in FIG. 9 that the protective diffusion layer 7 is disposed on the bottom of the trench 5 along the pattern of the trench 5.

With reference to FIG. 9, a triangle 18 whose vertices are the centers of three protective contact regions 15 located closest to one another is a right-angled triangle as indicated by dotted lines. The triangle 18 is a triangle whose vertices are the centers of the protective contact regions 15 and which has a minimum area.

The circumcenter of the triangle 18 corresponds to a point X. That is to say, the point X farthest from the protective contact regions 15 coincides with the position of the circumcenter of the triangle 18. In FIG. 9, a radius of a circle whose circumference center is the point X is a distance d. Letting the width of the cell region 14 be $W_{ch}$, the ratio of the protective contact regions 15 to the cell regions 14 be A, and an angle formed by the radius of a circumcircle of the triangle 18 and one side of the triangle 18 be θ as illustrated in FIG. 9, the distance d is expressed by (Expression 1).

$$d = W_{ch} * (1/A)^{1/2} / (2 \cos \theta) \quad \text{[Expression 1]}$$

In FIG. 9, the triangle 18 is an isosceles right triangle, and thus, θ is π/4, and (Expression 1) is as expressed as (Expression 2).

$$d = W_{ch} * (1/2A)^{1/2} \quad \text{[Expression 2]}$$

In FIG. 9, A is 1/9, and thus, the distance d is determined to be approximately $2.12 * W_{ch}$.

Figure 10:
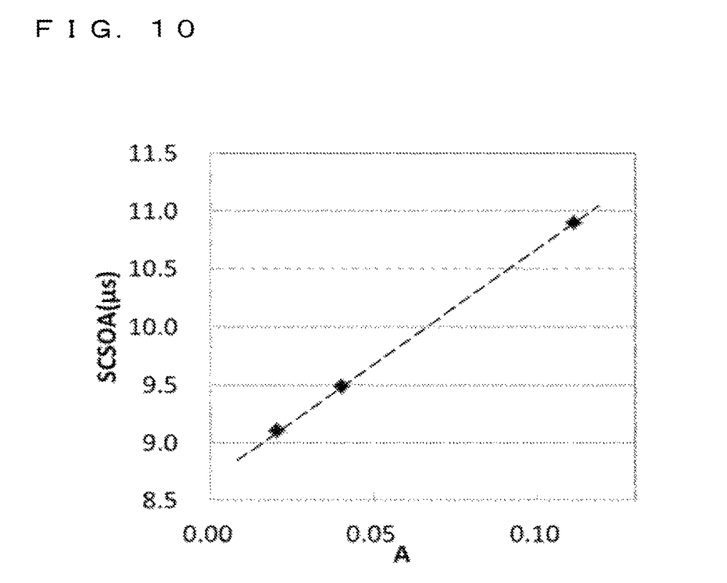
FIG. 10 illustrates experimental results showing a relationship between SCSOA indicating short-circuit withstand capability and A indicating a ratio of protective contact regions 15 to cell regions 14 in the case where an embodiment of the present invention is not used.

FIG. 10 illustrates a relationship between short-circuit withstand capability (SCSOA) obtained through experiment in the case where the present embodiment is not used and A that is a ratio of the protective contact regions 15 to the cell regions 14. Although the section of the semiconductor device is as illustrated in FIG. 2, the protective contact regions 15 are arranged as in FIG. 9 in which the present embodiment is not used.

FIG. 10 reveals that the SCSOA that is short-circuit withstand capability is proportional to the ratio A of the protective contact regions 15 to the cell regions 14. In this way, the inventors have found that the SCSOA depends on the ratio A of the protective contact regions 15 to the cell regions 14.

The inventors have further found that a breakdown occurred at the position corresponding to the point X of FIG. 9 as a result of the observation of the spot at which a breakdown occurred due to a short-circuit current. That is to say, FIG. 9 reveals that a MOSFET has a breakdown at the point X farthest from the protective contact region 15.

Figure 11:
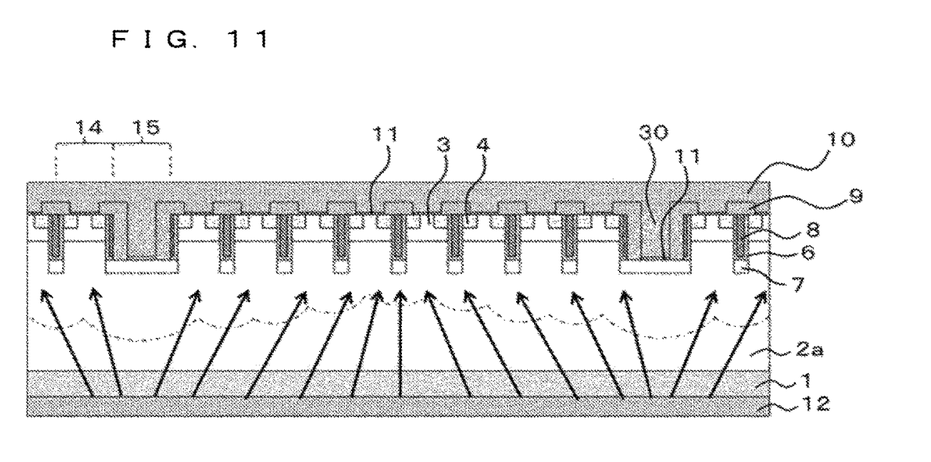
FIG. 11 is a sectional view of a MOSFET for explaining a breakdown mechanism of a MOSFET in short-circuit.

FIG. 11 is a view for explaining a MOSFET breakdown mechanism in short-circuit. When a high current flows from the drain electrode 12 toward the source electrode 10, a depletion layer extends toward the n-type drift layer 2a from the p-type base region 3 and the p-type protective diffusion layer 7 electrically connected to the source electrode 10. When the depletion layer has extended completely, the depletion layer occupies the entire drift layer 2a, and a short-circuit current flows from the drain electrode 12 toward the source electrode 10 through the depletion layer. Since the depletion layer occupies the entire drift layer 2a, the short-circuit current flows while being distributed relatively entirely in the drift layer 2a.

The depletion layer in a transition state from the occurrence of a short-circuit to its complete extension of the depletion layer is indicated by alternate long and short dashed lines in FIG. 11. From the occurrence of a short-circuit, that is, from a moment at which a high voltage is applied to the drain electrode, the depletion layer begins to extend toward the drift layer 2a from the p-type base region 3 and the p-type protective diffusion layer 7. Herein, the depletion layer extends faster as it is closer to the region of the drift layer 2a in which the base region 3 or the protective diffusion layer 7 is connected with the source electrode 10. A displacement current flows from the base region 3 and the protective diffusion layer 7 toward the source electrode 10 via a depletion capacitance at a pn interface. This is because the path through which a displacement current flows in the base region 3 or the protective diffusion layer 7 is shorter as the path is closer to a place at which the base region 3 or the protective diffusion layer 7 is connected with the source electrode 10.

The p-type base region 3 is connected with the source electrode 10 through the ohmic electrode 11 in each cell region 14, and accordingly, the depletion layer entirely extends from the base region 3 almost uniformly. The protective diffusion layer 7 is not connected with the source electrode 10 in the cell region 14 and is connected with the source electrode 10 through the ohmic electrode 11 in the protective contact region 15.

There is therefore a distribution in the speed at which the depletion layer extends from the protective diffusion layer 7 in accordance with the distance from the protective contact region 15. In other words, the depletion layer extends relatively faster from the protective diffusion layer 7 in the cell region 14 closer to the protective contact region 15 and extends more slowly in the cell region 14 farther from the protective contact region 15. The depletion layer extends fastest in the cell region 14 adjacent to the protective contact region 15 and extends more slowly as the depletion layer is farther from the protective contact region 15.

As illustrated in FIG. 11, thus, the depletion layer closer to the protective contact region 15 extends more, and the depletion layer farther from the protective contact region 15 extends less. The region in which the depletion layer extends least is the cell region 14 farthest from the protective contact region 15.

The depletion layer has a high resistance when the depletion layer extends in the drift layer 2a, and accordingly, a resistance becomes higher in the region in which the depletion layer has extended. In other words, a current flows less easily in the region in which the depletion layer has extended greatly.

The short-circuit current is indicated by arrows in FIG. 11. When there is a distribution in the extension of the depletion layer as illustrated in FIG. 11, a short-circuit current concentrates in the region in which the depletion layer extends less. That is to say, a short-circuit current locally concentrates in the region farthest from the protective contact region 15, and the temperature of the place of the concentration increases locally due to high current. This thermally damages an insulating film and a semiconductor, leading to a breakdown. An electrical damage due to a locally concentrated high current is one of the factors responsible for breakdown.

As described above, when a short-circuit current flows, a MOSFET breaks more easily at the point X farthest from the protective contact region 15. Thus, as the distance d expressed by (Expression 1) is smaller, the MOSFET breaks less easily, and the reliability of the semiconductor device can be improved. In other words, as the distance d is smaller, the distribution of the speed at which the depletion layer extends in the active region can be reduced more. Consequently, the local concentration of a short-circuit current can be mitigated, leading to improvement in short-circuit withstand capability.

Although one in a division of nine cell regions 14 is replaced by the protective contact region 15 in FIG. 9, as seen from FIG. 10, the distance d can be made smaller in the case where one in a division of cell regions 14 is replaced by the protective contact region 15 than in the case where one in a division of 25 cell regions 14 is replaced by the protective contact region 15, and further, the distance d can be made smaller in the case where one in a division of four cell regions 14 is replaced by the protective contact region 14. This is because A in (Expression 1), that is, the ratio of the protective contact regions 15 to the cell regions 14 is increased.

As described above, the distance d can be made smaller as the ratio of the number of protective contact regions 15 to the number of cell regions 14 is made larger. Consequently, breakdown can be restrained at the point X, and short-circuit withstand capability can be improved, thus improving the reliability of the semiconductor device.

The protective contact region 15, however, does not have the function as a MOS channel, and thus, increasing the ratio of the protective contact regions 15 to the cell regions 14 reduces the MOSFET cells, that is, reduces a channel density. This increases a channel resistance, thus increasing on-resistance. That is to say, there is a trade-off relationship between an increase in on-resistance and an improvement in short-circuit withstand capability.

Figure 12:
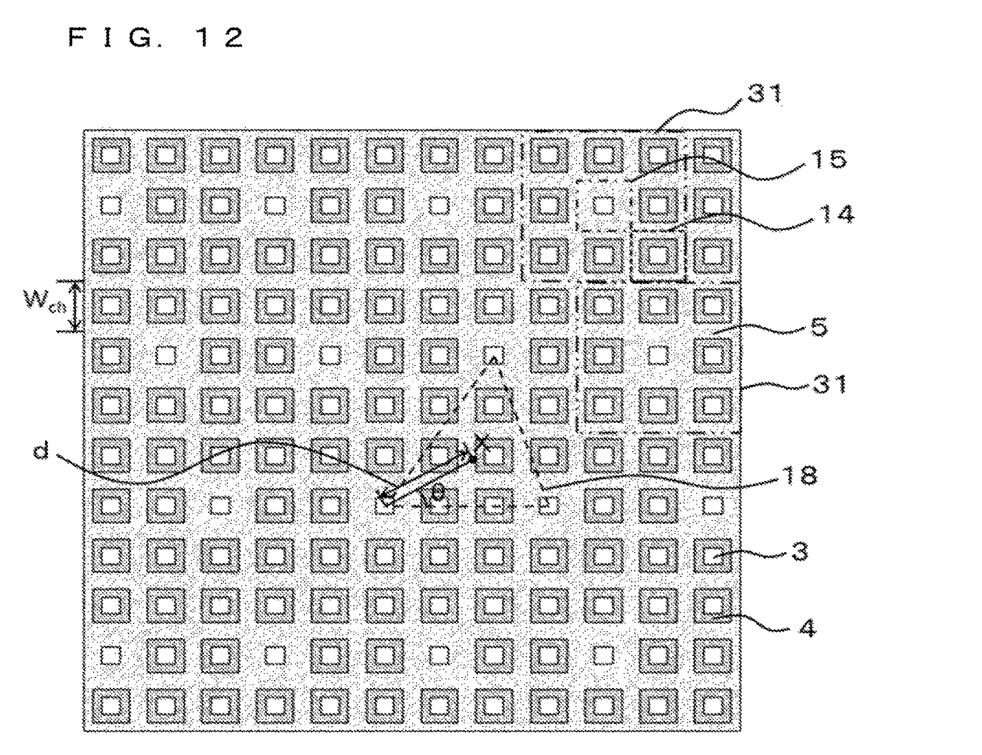
FIG. 12 is a top view of a semiconductor device according to the first embodiment of the present invention.

FIG. 12 is a plan view for explaining the effects of the semiconductor device according to the present embodiment. FIG. 12 is a plan view for determining the distance d in the arrangement of FIG. 1 illustrating the semiconductor device according to the present embodiment.

As illustrated in FIG. 12, the divisions 31 in each of which the center position of nine cell regions 14 is replaced by the protective contact region 15 are disposed in order in the present embodiment, but the protective contact regions 15 in the divisions 31 vertically adjacent to one another are shifted horizontally. A triangle 18 whose vertices are the centers of three protective contact regions 15 located closest to one another is thus an acute triangle. An angle $\theta$ is thus smaller than $\pi/4$. The angle $\theta$ is formed between the radius of a circumcircle of the triangle 18, which connects the point X and the center of the protective contact region 15, and one side of the triangle 18 extending from the center of the protective contact region 15.

In the present embodiment, thus, $\cos \theta$ in (Expression 1) is greater than that in the case of FIG. 9, and accordingly, the distance d is smaller than that in the case of FIG. 9. The distance d in the case of FIG. 11 is determined from (Expression 1), which is approximately $1.90 * W_{ch}$. This is an 11% reduction compared with the case of FIG. 9.

Thus, even in the cases where the division 31 is similarly formed of eight cell regions 14 and one protective contact region 15, the distance from the point X farthest from the protective contact region 15 to the protective contact region 15 can be made smaller in the case of FIG. 11 in which the present embodiment is used than in the case of FIG. 9 illustrating a comparative example. Consequently, the local concentration of a short-circuit current can be mitigated without an increase in the number of protective contact regions 15.

Figure 13:
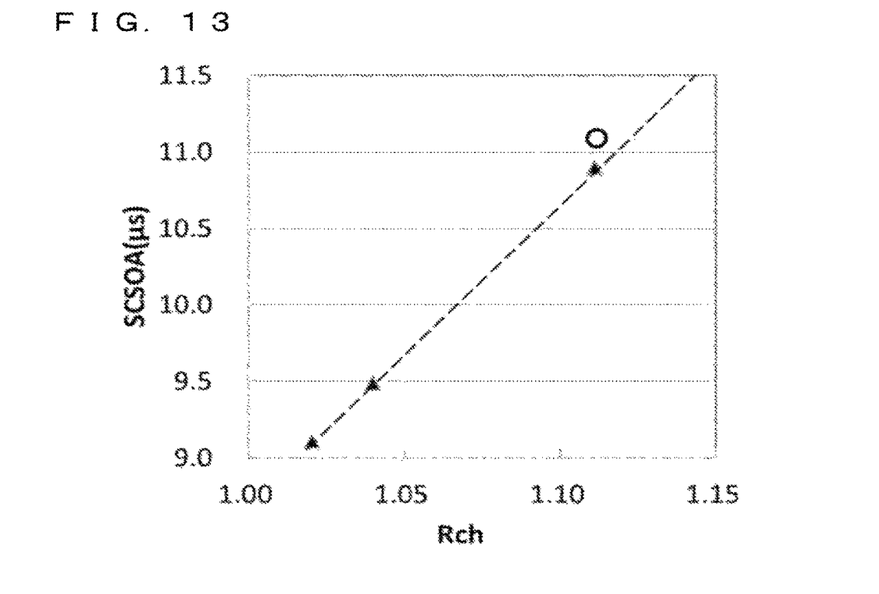
FIG. 13 illustrates a relationship between channel resistance $R_{ch}$ and short-circuit withstand capability SCSOA.

FIG. 13 illustrates a relationship between channel resistance ($R_{ch}$) and short-circuit withstand capability (SCSOA). In FIG. 13, the relationship between short-circuit withstand capability and $R_{ch}$ in the case where the present embodiment is not used, which is illustrated in FIG. 9, is indicated by black triangles. Herein, $R_{ch}$ is calculated by setting $R_{ch}$ in the case where no protective contact region 15 is formed to 1.0 and calculating an increase amount of $R_{ch}$ from a reduction amount of a channel density in the case where the protective contact region 15 is provided. The short-circuit withstand capability (SCSOA) is a value obtained through experiment.

It is revealed that increasing $R_{ch}$ increases SCSOA as illustrated in FIG. 13. In FIG. 13, $R_{ch}$ and SCSOA are indicated by the relationship of a dotted line and have a trade-off relationship. In the case where the characteristics in the region above the dotted line of FIG. 13 were obtained, it is indicated that SCSOA was improved while restraining an increase in $R_{ch}$, indicating that the trade-off relationship was improved.

In FIG. 13, characteristics by a white circle indicate the case where the present embodiment was used. It is revealed that in the case where the present embodiment was used, high SCSOA was obtained while restraining an increase in $R_{ch}$ compared with the case indicated by a dotted line of FIG. 13. That is to say, the present embodiment can improve short-circuit withstand capability while restraining an increase in on-resistance.

As described above, the semiconductor device according to the present embodiment makes the triangle 18, whose vertices are the centers of three protective contact regions 15 disposed closest to one another, as an acute triangle. This reduces the distance between the protective diffusion layer 7 and the protective contact region 15 located farthest from each other without an increase in channel density, achieving an effect of simultaneously restraining an increase in on-resistance and a breakdown due to a short-circuit current. That is to say, the present embodiment can improve a trade-off relationship between on-resistance and short-circuit withstand capability without requiring complicated manufacturing steps.

Although the depth of the groove 30 of the protective contact region 15 is identical to the depth of the trench 5 in the present embodiment, these depths may differ. Alternatively, no groove 30 may be provided. The ohmic electrode in the protective contact region 15 may be formed on the surface of the epitaxial layer as in the cell region 14. The thickness of the protective diffusion layer 7 in the depth direction may be increased only in the protective contact region 15 such that the base region 3 and the protective diffusion layer 7 are connected to each other in the protective contact region 15.

Although the SiC substrate 1 is used as a semiconductor substrate in the present embodiment, any other semiconductor material may be used, such as Si or wide bandgap semiconductor.

Examples of the wide bandgap semiconductor include gallium-nitride-based material and diamond in addition to SiC. These materials are promising next-generation semiconductor materials to be used in technical fields handling approximately 1 kV or higher voltages.

It is known that the MOSFET including SiC has an electron trap at a MOS interface that is greater than that of Si by one order or more. Thus, the ratio of channel resistance to on-resistance is large. Channel resistance increases as channel density decreases, and accordingly, an increase rate of on-resistance is large in SiC when the number of protective contact regions 15 is increased.

It is known that a MOSFET including SiC, which has a lower on-resistance and produces a larger short-circuit current than a Si device having a breakdown voltage comparable to that of the MOSFET, generates more heat and more easily has a breakdown of a gate oxide film. In other words, the following problem is known: the short-circuit withstand capability of SiC may be lower than that of Si.

For the reason above, SiC has a remarkable trade-off relationship between on-resistance and short-circuit withstand capability. Thus, in the application of the present embodiment to a semiconductor device including SiC, an effect of improving a tradeoff between on-resistance and short-circuit withstand capability is especially noticeable.

Although the division 31 is formed of eight cell regions 14 and one protective contact region 15 in the present embodiment, needless to say, the division 31 may include an appropriate number of cell regions 14. For example, the division 31 may include 48 cell regions 14 and one protective contact region 15, 24 cell regions 14 and one protective contact region 15, or three cell regions 14 and one protective contact region 15.

Although the cell region 14 has a rectangular shape in the present embodiment, it may have any other polygonal shape such as a hexagonal shape. Alternatively, if the cell region 14 has any other shape as a circular shape, the effects of the present embodiment can be achieved.

Figure 14:
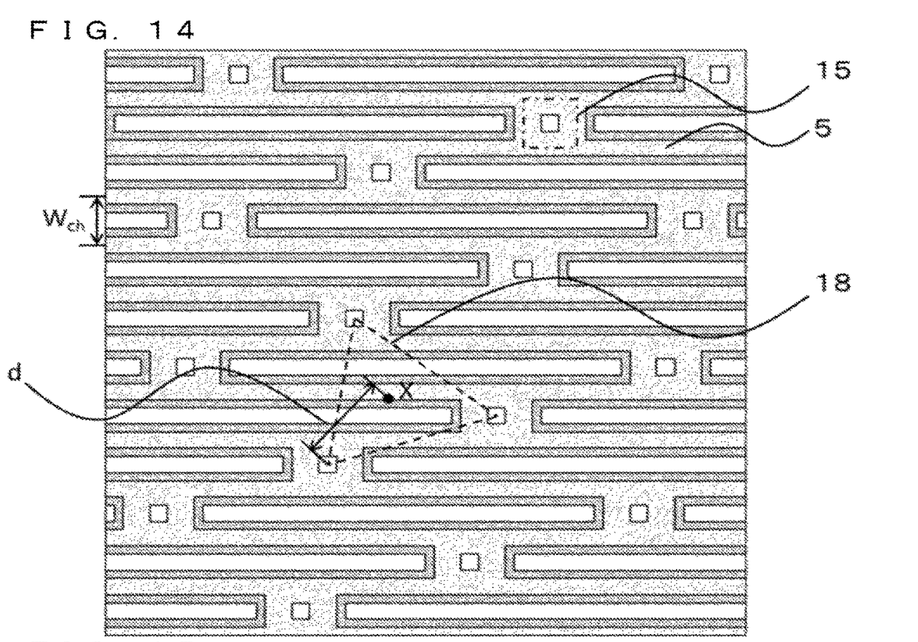
FIG. 14 is a top view of a semiconductor device having a comb pattern according to the first embodiment of the present invention.

Not a cell pattern but a comb pattern may be provided. FIG. 14 is a top view in the case where the present embodiment is used to form the protective contact regions 15 in a MOSFET region having a comb pattern. The protective contact regions 15 may be formed so as to divide the MOSFET cell having a comb pattern. That is to say, some of the cell regions 14 may be the protective contact regions 15. Even in the comb pattern, the protective contact regions 15 are arranged such that a triangle 18 connecting the centers of three protective contact regions 15 located closest to one another is an acute triangle.

In the arrangement of FIG. 14, letting the width of the comb-shaped stripe be $W_{ch}$, a distance d is $1.93*W_{ch}$.

At least one protective contact region 15 is desirably provided in every stripe in the comb pattern as illustrated in FIG. 14. This aims to prevent a switching operation from becoming unstable due to the generation of the protective diffusion layer 7 that will have a floating potential.

Figure 15:
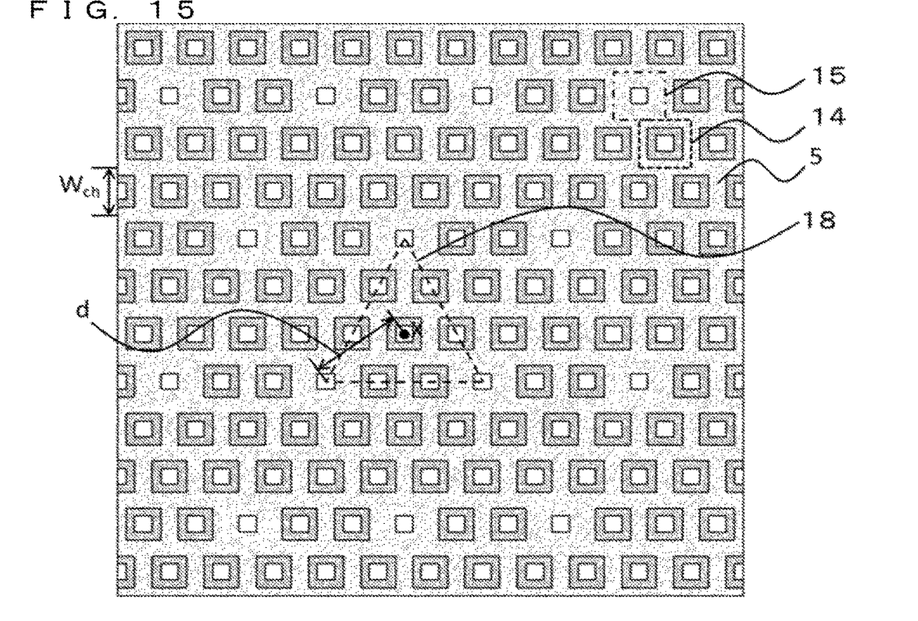
FIG. 15 is a top view of a semiconductor device having a staggered pattern according to the first embodiment of the present invention.

The cell regions 14 may be arranged in a staggered pattern. FIG. 15 is a top view in the case where the present embodiment is used to form the protective contact regions 15 in a MOSFET region having a staggered pattern. In this case, a triangle 18 connecting the centers of three protective contact regions located closest to one another is a regular triangle, and a distance d can be minimized, $1.88*W_{ch}$.

As described above, even in the arrangement that is not described in the present embodiment, the effects of the present embodiment can be achieved if a triangle 18 connecting the centers of three protective contact regions located closest to one another is an acute triangle.

The present embodiment is also applicable to IGBTs. Replacing the SiC substrate 1 with a p-type substrate in the structure illustrated in FIG. 2 achieves an IGBT. In that case, the source region 4 and the source electrode 10 of the MOSFET respectively correspond to an emitter region and an emitter electrode of the IGBT, and the drain electrode 12 of the MOSFET corresponds to a collector electrode of the IGBT.

Second Embodiment

Figure 16:
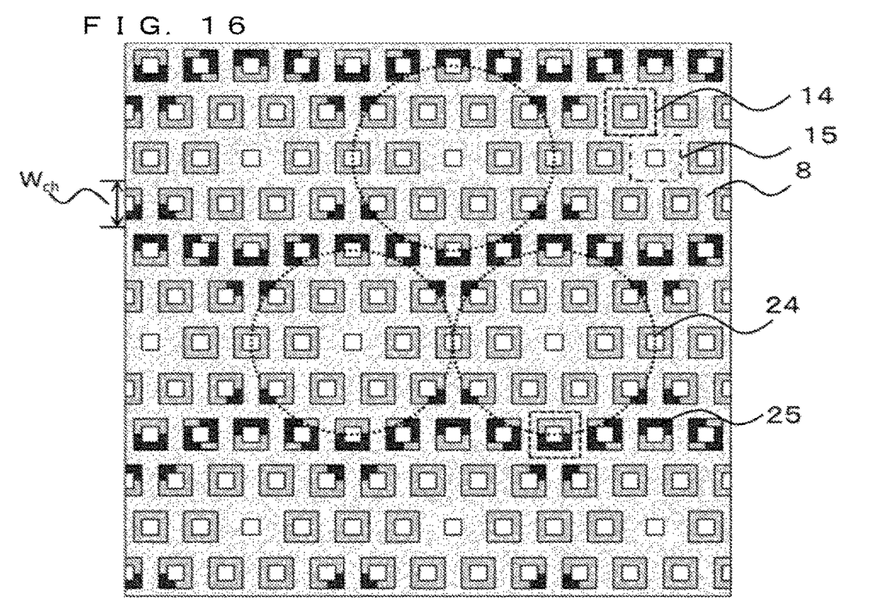
FIG. 16 is a top view of a semiconductor device according to a second embodiment of the present invention.
Figure 17:
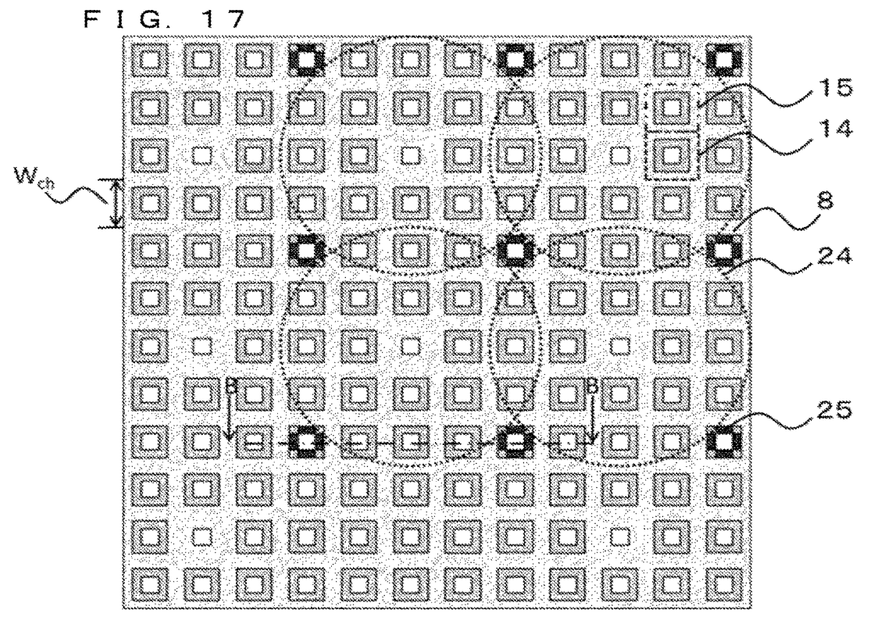
FIG. 17 illustrates another example of the top view of the semiconductor device according to the second embodiment of the present invention.

FIGS. 16 and 17 are tops views of a semiconductor device according to a second embodiment. The semiconductor device of the present embodiment is characterized in that channel regions remote from the protective contact regions 15 are deactivated. The second embodiment is similar to the first embodiment in the other respects. The present embodiment achieves an effect of improving short-circuit withstand capability.

With reference to FIGS. 16 and 17, if circles 24 are each drawn around the protective contact region 15, deactivation channels 25 that are caused not to function as MOS channels may be channels located outside the circles 24.

In this case, the radius of the circle 24 is one or more times and three or less times, desirably, two or less times the width $W_{ch}$ of the cell region 14. This is because an on-resistance increases due to an increase in the ratio of deactivated channels if the radius is smaller than one time the width $W_{ch}$, and an effect of improving short-circuit withstand capability cannot be achieved sufficiently if the radius is greater than three times the width $W_{ch}$.

For example, the radius of the circle 24 illustrated in FIG. 16 is twice the width $W_{ch}$, and the radius of a circle 24 illustrated in FIG. 17 is 2.5 times the width $W_{ch}$. The ratio of channels to be deactivated is reduced to reduce the radius of the circle 24, and thus, a ratio 1/A at which protective contact regions 25 are arranged is desirably increased.

When a MOSFET region is arranged in a stripe pattern, the radius of the circle 24 may be determined with respect to the distance between short sides that is the width $W_{ch}$ of a stripe.

Figure 18:
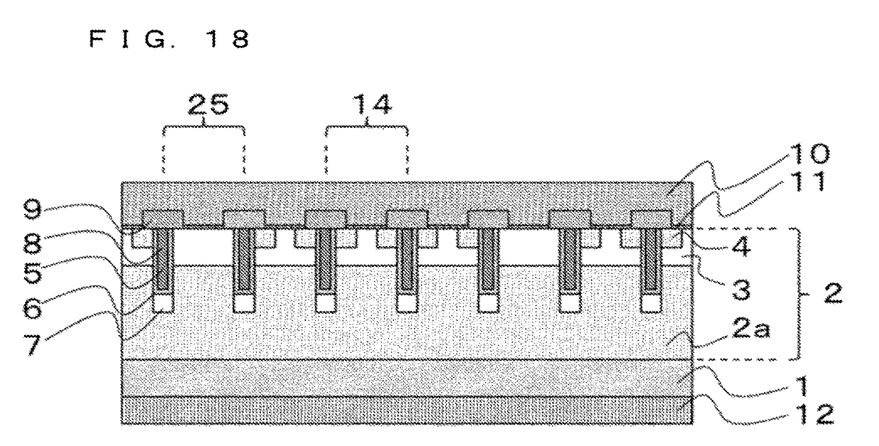
FIG. 18 is a sectional view of the semiconductor device according to the second embodiment of the present invention.

FIG. 18 is a sectional view of the semiconductor device according to the present embodiment. FIG. 18 shows a section taken along a line BB of FIG. 17.

With reference to FIG. 18, no source region 4 is formed in the region of the deactivation channel 25. That is to say, in the deactivation channel 25, all the side surfaces of the trench 5 are opposed to the base region 3 through the gate insulating film 6. Forming no source region 4 in the deactivation channel 25 prevents the formation of a MOS channel in the deactivation channel 25 during on time and prevents the deactivation channel 25 from functioning as a MOS channel.

In short-circuit, a short-circuit current concentrates in a region remote from the protective contact region 15, as described with reference to FIG. 11 in the first embodiment. The concentrated short-circuit current flows through the cell region 14 of the region remote from the protective contact region 15 into the source electrode 10.

The formation of any MOS channel in short-circuit causes a high current to flow due to a small resistance of a channel region, leading to breakdown of the gate insulating film 6. If no MOS channel is formed in the channel region, the channel region has a high resistance, achieving an effect of mitigating the concentration of current. That is to say, in the region of the deactivation channel 25, a current flows less easily due to a drain-source channel resistance higher than that of the other region.

In other words, the present embodiment increases the resistance of a channel because the channel region is remote from the protective contact region 15 and the depletion layer extends a little. This achieves an effect of mitigating the concentration of a short-circuit current.

As described above, the present embodiment achieves the effects of increasing a channel resistance in the region in which a short-circuit easily concentrates due to the depletion layer extending slowly, and mitigating the concentration of a short-circuit current, thereby improving short-circuit withstand capability. Since the deactivation channel 25 does not function as a MOS channel, the channel resistance increases. However, only the channel in the region in which a short-circuit concentrates is deactivated, so a channel in an unwanted region is not deactivated. This improves short-circuit withstand capability while minimizing an increase in channel resistance.

In the arrangement in which one protective contact region is provided for 15 cell regions 14 as illustrated in FIG. 16, when the channels in the region that is not included in a region with a distance twice the distance between cells $W_{ch}$ from the protective contact region 15 are deactivated, the ratio of the deactivation channels 25 is approximately 21% in the case of FIG. 16 and approximately 3% in the case of FIG. 17. As described above, short-circuit withstand capability can be improved greatly while inhibiting an increase in on-resistance.

Although the effect of improving short-circuit withstand capability can be achieved more sufficiently in the combination of the present embodiment with the first embodiment as illustrated in FIG. 16, the effects of the present embodiment can be achieved also in the arrangement as illustrated in FIG. 17.

Figure 19:
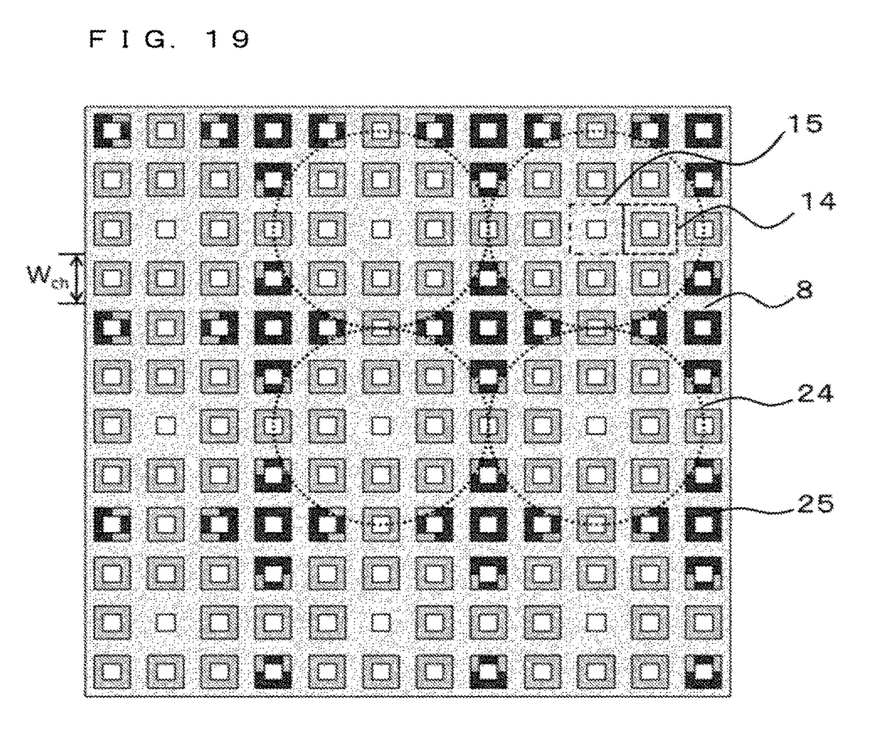
FIG. 19 illustrates still another example of the top view of the semiconductor device according to the second embodiment of the present invention.

FIG. 19 is a top view of another example of the arrangement of the semiconductor device of the present embodiment. The radius of a circle 24 illustrated in FIG. 19 is twice the width $W_{ch}$. While the cells are arranged in a staggered pattern in FIG. 16, the cells are arranged in a lattice pattern in FIG. 19. In FIG. 19, the protective contact regions 15 are also arranged in a lattice pattern. In FIG. 19, the ratio of the deactivation channels 25 is 23%.

Needless to say, any method different from the method that does not involve forming the source region 4 may be used to form the deactivation channels 25. For example, a high-concentration p-type impurity is introduced into the region of the deactivation channel 25. That is to say, the base region 3 in the deactivation channel 25 has an impurity concentration higher than the impurity concentration of the base region 3 in the cell region 14 that is not deactivated. In this case, the deactivation channel 25 is resistant to inversion to n-type during on time and functions as a MOS channel less easily. In other words, the channel resistance in the relevant region is increased.

As described above, if the deactivation channel 25 does not function as a MOS channel completely, the effects of the present embodiment can be achieved as long as the deactivation channel 25 has a channel resistance higher than that of the other channel region.

In another embodiment, for example, the channel length of the deactivation channel 25 may be greater than that of any other region. The channel resistance in the deactivation channel 25 increases because the channel length is larger, and accordingly, the effects of the present embodiment can be achieved.

In the present embodiment, the region of the cell region 14 in which a short-circuit current concentrates is the deactivation channel 25. In the first embodiment, in the cell region 14 adjacent to the protective contact region 15, the gate electrode 8 narrows on the surface of contact with the protective contact region 15. This leads to a fear that a delay may occur due to a break in a gate or an increase in gate resistance along with an increase in the ratio at which the protective contact regions 15 are arranged.

The present embodiment does not narrow the gate electrode 8, thus improving short-circuit withstand capability while maintaining a manufacturing yield that is affected by a defective gate.

The second embodiment of the present invention has described the differences from the first embodiment of the present invention, and the same or corresponding descriptions have been omitted.

EXPLANATION OF REFERENCE SIGNS

1 SiC substrate, 2 epitaxial layer, 2a drift layer, 3 base region, 4 source region, 5 trench, 6 gate insulating film, 7 protective diffusion layer, 8 gate electrode, 9 interlayer insulating film, 10 source electrode, 11 ohmic electrode, 12 drain electrode, 14 cell region, 15 protective contact region, 18 triangle, 21 silicon oxide film mask, 22 etching mask, 23 implantation mask, 24 circle, 25 deactivation channel, 30 groove, 31 division.

The invention claimed is:

1. A semiconductor device, comprising:

a substrate;

a drift layer of a first conductivity type provided on said substrate;

a base region of a second conductivity type formed on said drift layer;

a source region of the first conductivity type located in said base region;

a trench passing through said base region and said source region, a bottom of the trench reaching said drift layer, the trench dividing the semiconductor device into a plurality of regions including cell regions and protective contact regions in a plan view;

a protective diffusion layer of the second conductivity type disposed on the bottom of said trench in said drift layer, the protective diffusion layer spanning an entire width of the trench in a cross-sectional view;

a gate insulating film formed on an inner wall of said trench;

a gate electrode embedded in said trench with said gate insulating film therebetween; and a source electrode electrically connected to said source region, wherein three of the protective contact regions closest to one another are disposed at vertices of a triangle in the plan view, the vertices of the triangle corresponding to centers of the three of said-protective contact regions, the triangle being an acute triangle, each of the protective contact regions connects said protective diffusion layer to said source electrode, and said cell regions and said protective contact regions each have a same width in the plan view.

2. The semiconductor device according to claim 1, wherein said trench is formed such that said cell regions are arranged in a lattice pattern.

3. The semiconductor device according to claim 1, wherein said trench is formed such that said cell regions are arranged in a staggered pattern.

4. The semiconductor device according to claim 1, wherein said trench is formed such that said cell regions are arranged in a comb pattern.

5. The semiconductor device according to claim 1, wherein said protective diffusion layer contains an impurity of the second conductivity type within a concentration range of $3\times10^{17}$ cm$^{-3}$ or more and $1\times10^{18}$ cm$^{-3}$ or less.

6. The semiconductor device according to claim 1, wherein each of said protective contact regions includes a groove having such a depth as to reach said protective diffusion layer.

7. The semiconductor device according to claim 1, wherein said protective contact regions connect said protective diffusion layer and said source electrode to each other through an ohmic electrode, and in each of said protective contact regions, said protective diffusion layer includes a high-concentration region having an impurity concentration of the second conductivity type of $5\times10^{18}$ cm$^{-3}$ or more and $1\times10^{21}$ cm$^{-3}$ or less in an area in contact with said ohmic electrode.

8. The semiconductor device according to claim 1, wherein said substrate comprises a wide-bandgap semiconductor including gallium-nitride-based semiconductor or diamond.

9. The semiconductor device according to claim 1, wherein said substrate comprises silicon carbide.

* * * * *